(12) United States Patent
O'Brien et al.

(10) Patent No.: US 6,396,864 B1
(45) Date of Patent: May 28, 2002

(54) THERMALLY CONDUCTIVE COATINGS FOR LIGHT EMITTING DEVICES

(75) Inventors: Stephen O'Brien, Sunnyvale; Julian S. Osinski, Palo Alto, both of CA (US)

(73) Assignee: JDS Uniphase Corporation, San Jose, CA (US)

( * ) Notice: Subject to any disclaimer, the term of this patent is extended or adjusted under 35 U.S.C. 154(b) by 0 days.

(21) Appl. No.: 09/042,072

(22) Filed: Mar. 13, 1998

(51) Int. Cl.[7] .................................................. H01S 3/19
(52) U.S. Cl. ........................................... 372/49; 372/45
(58) Field of Search ............................. 372/43, 44, 49, 372/45–48

(56) References Cited

U.S. PATENT DOCUMENTS

| | | | |
|---|---|---|---|
| 4,178,564 A | | 12/1979 | Ladany et al. ................ 372/49 |
| 4,337,443 A | | 6/1982 | Umeda et al. ................. 372/49 |
| 4,656,638 A | * | 4/1987 | Tihanyi et al. ................ 372/49 |
| 4,815,089 A | | 3/1989 | Miyauchi et al. ............. 372/49 |
| 4,839,901 A | | 6/1989 | Mozer et al. .................. 372/49 |
| 4,860,305 A | | 8/1989 | Miyauchi et al. ............. 372/92 |
| 4,894,832 A | * | 1/1990 | Colak ............................ 372/44 |
| 4,914,668 A | | 4/1990 | Nagai et al. ................... 372/49 |
| 4,951,291 A | | 8/1990 | Miyauchi et al. ............. 372/49 |
| 5,237,582 A | * | 8/1993 | Moses ........................... 372/53 |
| 5,299,214 A | | 3/1994 | Nakamura et al. ........... 372/46 |
| 5,313,483 A | | 5/1994 | Kozlovsky et al. ........... 372/15 |
| 5,355,382 A | | 10/1994 | Kovacs et al. ................ 372/36 |
| 5,422,901 A | | 6/1995 | Lebby et al. .................. 372/36 |
| 5,454,002 A | | 9/1995 | McCann ........................ 372/36 |
| 5,497,389 A | * | 3/1996 | Kasukawa et al. ............ 372/49 |
| 5,665,637 A | | 9/1997 | Chand ........................... 372/46 |
| 5,777,792 A | * | 7/1998 | Okada et al. ................. 359/584 |
| 5,923,690 A | * | 7/1999 | Kume et al. .................. 372/46 |
| 5,943,356 A | * | 8/1999 | Kawai ........................... 372/49 |
| 5,960,021 A | * | 9/1999 | De Vrieze et al. ............ 372/49 |
| 5,962,873 A | * | 10/1999 | Ohkubo et al. ............... 257/94 |
| 6,067,310 A | * | 5/2000 | Hashimoto et al. ........... 372/49 |

OTHER PUBLICATIONS

Ediger et al., ed. Electro–Optics Handbook, 1994 (mo month). See graphs 11.1c–d and 11.3c–d.*

Tako Furse et al., Insulating Carbon Coating on (AlGa)As DH Laser Facets, Applied Physics Letters, vol. 33(4), pp. 317–318, Aug. 15, 1978.

(List continued on next page.)

Primary Examiner—Hemang Sanghavi
(74) Attorney, Agent, or Firm—Harness, Dickey & Pierce, P.L.C.

(57) ABSTRACT

A light emitting device, such as semiconductor laser diodes, superluminescent devices, semiconductor amplifiers and polymer-based light emitting devices, is provided with a coating that will increase the thermal conductivity at one or more facets of the device to provide for lowering the facet temperature during device operation to suppress the occurrence of temperature dependent facet degrading mechanisms and the catastrophic optical damage (COD) level of the light emitting device since these facet attributes are directly affected by temperature at the facet. In the preferred embodiment, the coating should have a thermal conductivity that is higher than the material of the light emitting device. The high thermal conductivity coating provides for an efficient transfer of heat away from the beam emission area of the front facet into regions adjacent to, i.e., above or below the active region of the device, such as layers of the device underlying the active region and the device substrate. If the coating material does not provide a sufficiently high level of thermal conductivity, then thermal resistance should be taken into consideration and the coating should be made thicker to achieve lower thermal resistance and, therefore, higher heat spreading toward lowering the facet temperature. In either case, the rate of heat transfer from the facet is enhanced so that the onset of higher temperature dependent facet degrading mechanisms and COD developing at the device facet are reduced or suppressed.

16 Claims, 3 Drawing Sheets

OTHER PUBLICATIONS

Mitsuo Fukuda et al., The Stability of Coating Film—Mirror Facet Interfaces of AlGaAs/GaAs DH Laser Diodes, Japanese Journal of Applied Physics, vol. 19(10), pp. 1969–1974, Oct. 1980, 1978.

Hans Brugger et al., Mapping of Local Temperatures on Mirrors of GaAs/AlGaAs Laser Diodes, Applied Physics Letters, vol. 56(11), pp. 1049–1051, Mar. 12, 1990.

R. R. Drenten et al., Semiconductor Laser Far–Field Shaping by Angle–Selective Facet Coating, Applied Optics, vol. 30(27), pp. 3846–3851, Sep. 20, 1991.

A. Moser, Thermodynamics of Facet Damage in Cleaved AlGaAs Lasers, Applied Physics Letters, vol. 59(5), pp. 522–524, Jul. 29, 1991.

F. R. Nash et al., Improvements of the Electro–Optic Properties of (AlGa)As Lasers by Means of Reduced Reflection Dielectric Facet Coatings, Journal of Applied Physics, vol. 52(1), pp. 48–54, Jan., 1981.

* cited by examiner

THERMALLY CONDUCTIVE COATINGS FOR LIGHT EMITTING DEVICES

FEDERALLY SPONSORED RESEARCH AND DEVELOPMENT

The invention was supported under Government Contract No. 70NANB2H1241 through NIST. The government has certain rights to the invention.

BACKGROUND OF THE INVENTION

1. Field of the Invention

The invention is directed to light emitting devices, and more particularly, to coatings for the facets of such devices that provide for high thermal conductivity, in part through lower thermal resistance, to enhance the transfer of heat away from the high temperature, beam emission area of the facet to improve device lifetime and reliability.

2. Related Art

Over the past fifteen years or more, much has been discussed about the passivation, hermeticity or protection of facet surfaces of laser diodes, particularly relative to the front or emitting facet. The emitting facet is also commonly referred to as the output facet of the laser diode. Passivation is the process of protecting the facet from environmental or ambient effects, particularly to oxidation, by isolating the facet from the environment. A coating is applied to the facet and its thickness is adjusted to obtain a desired level of light reflectivity at the light emitting device facet. The need to adjust the coating thickness to achieve the desired level of facet reflectivity is well known in the art. A coating may be applied to the facet surface having a thickness of $\lambda/4$ where $\lambda$ is the laser wavelength of operation, so as to yield a low reflectivity and to enhance the lifetime of the laser. Films, such as $SiO_2$ or $Al_2O_3$, are typically used as such protective coatings and are deposited directly on the facet surface. Also, the published art discusses problems relating to chemical stability, such as the effect of facet erosion due to the high intensity output of optical power at the facet as well as facet passivation treatment. An example of such passivation treatment is disclosed in the 1982 U.S. Pat. No. 4,337,443 of Umeda et al. entitled, SEMICONDUCTOR LASER DEVICE WITH FACET PASSIVATION FILM. In patent '443, it is recognized that conventional passivation may not provide satisfactory protection against facet erosion attributable to photo-chemical processes that erode the facet, the result of which decreases the laser reliability. The increase in facet erosion is suppressed by the employment of an insulating film of an amorphous material that contains silicon and hydrogen as indispensable elements ($\alpha$-Si:H). The thickness of the coating material is in the vicinity of $\lambda/4n$, where $\lambda$ is the laser wavelength in the material and n is the refractive index of the film, providing for maximum power output. In another patent in 1989, U.S. Pat. No. 4,815,089 to Miyauchi et al., discloses the use of a single layer of $Al_2O_3$ or $SiO_2$ on the output facet for passivation, having a thickness preferably of $\lambda/3$, to properly select a reflectivity in the range of 10% to 20% and provide a stabilized out-put at high powers. The concept disclosed in Patent '089 is to select the proper thickness of the dielectric film to suppress problems relating to increased threshold, astigmatism and optical feedback noise.

In another 1989 patent to Miyauchi et al., U.S. Pat. No. 4,860,305, an external cavity laser is disclosed where the rear facet is optically coupled with an external cavity for eliminating longitudinal mode hopping. The emitting facet includes a single film of $Al_2O_3$, which is likely provided for the reasons given in Patent '089, of achieving stabilized single longitudinal mode control at higher powers in spite of aging effects.

In yet another Miyauchi et al. patent, U.S. Pat. No. 4,951,291, the emitting facet is provided with a multi-layer, dielectric coating to provide a protective coating so that oxidation of the front facet can be suppressed to attain an increase of the life span of the laser. The coating comprises a first layer of $Al_2O_3$ and a second layer of $\alpha$-Si:$H_2$ which is effective for providing high reflectivity, such as 30% or less, as well as suppressing oxidation.

In the foregoing disclosures, only issues of passivation and chemical stability are addressed. Interestingly, no mention or discussion as to the effects of optical power at the facet output and its contribution to the development of high temperatures at the area of beam emission at the facet, the thermal conductivity of the facet coating and its relation to coating thickness to achieve lower thermal resistance, the causes of different photo-chemical reaction rates in facet degradation, how catastrophic optical damage (COD) occurs and can be suppressed to increase device lifetime, how thermal conductivity might be taken into account in the development of facet coatings relative to desired materials for coatings as well as coating thicknesses, and the consideration of thermal conductivity in combination with passivation and chemical stability. U.S. Pat. No. 5,422,901 to Lebby et al. employs a high thermal conductive layer in the form of diamond-like carbon (DLC) surrounding a vertical cavity laser (VCSEL) device, but does not deal with the horizontal cavity laser with an end cleaved facet having a high density output beam, i.e., there is no discussion is made of the development and employment of high thermally conductive coatings at the beam emission area to lower the device temperature at this area to enhance device lifetime and reliability. Moreover, heating is due to high current operation of the vertical cavity device and not due to optical heating of the facet due to optical absorption of a high intensity beam formed by a diffraction limited aperture provided by horizontal cavity, cleaved facet, edge emitting laser device. Also, there is no disclosure or suggestion of how to accomplish efficient heat removal from the output facet of a light emitting device with a cavity emission from a cleaved facet.

A limiting aspect of high-power single-mode and broad area light emitting devices, such as semiconductor lasers, is catastrophic optical damage (COD). COD is a thermal runaway event occurring at the emitting facet of a light emitting device. COD is a function of operational temperature of the light emitting device, the cavity width and length of the light emitting device as well as the current density and optical power density at the output facet. Facet aging leads to increased optical absorption due to surface oxidation or other chemical reactions and, ultimately, to COD which limits the lifetime or reliability of the device. Various methods for postponing the aging process by passivating the output facet have been proposed for prolonging the onset of COD as suggested by the previously discussed disclosures. High quality passivation, however, is often difficult to achieve. Moreover, absorbed optical power at the device facet is what causes a temperature rise at the facet, leading to high facet temperatures that rapidly increase in reaction rates for facet degradation mechanisms, such as chemical or photo-chemical erosion and passivation coating degradation or breakdown over time, or decrease of COD level, all due to such high facet temperatures, shortening the life time of the light emitting device. The invention herein represents an approach for achieving lower facet temperatures for increasing the COD power before, during and after facet aging, extending the life of the device through proper coating of the device facets while concurrently maintaining proper reflectivity as well as providing facet passivation and chemical stability.

Thus, it is an object of this invention to provide a coating for facets of a light emitting device that provides for a lower facet temperatures during device operation by more effectively carrying away heat developed at the facet suppressing the material onset of temperature dependent facet degrading mechanisms occurring at the facet surfaces so that higher power outputs may be achieved with improved device reliability and lifetime.

SUMMARY OF THE INVENTION

According to this invention, a light emitting device is provided with a coating that will increase the thermal conductivity at one or more facets of the device to provide for lowering the facet temperature during device operation to suppress the occurrence of temperature dependent facet degrading mechanisms affecting facet chemical stability, hermeticity and catastrophic optical damage (COD) level of the light emitting device since these facet attributes are directly affected by temperature at the facet. In the preferred embodiment, the coating should have a thermal conductivity that is higher than the material of the light emitting device. The high thermal conductivity coating provides for an efficient transfer of heat away from the beam emission area of the front facet into regions adjacent to, i.e., above or below the active region of the device, such as layers of the device underlying the active region and the device substrate. Moreover, the coating can be extended to be in direct contact with the device submount in order to possibly further enhance heat conduction away from the facet. If by coating material does not provide a sufficiently high level of thermal conductivity, then, in addition, thermal resistance should also be taken into consideration and the coating should be made thicker to obtain lower thermal resistance to achieve higher thermal transfer benefits toward lowering the facet temperature. In either case, the rate of heat transfer from the facet is enhanced so that the onset of higher temperature dependent facet degrading mechanisms developing at the device facet are reduced or suppressed. The higher the power output from the device facet, the higher the facet temperature and the prospects of early device failure due to COD. By lowering the facet temperature, for example, the onset of chemical instability developing at the facet is reduced, such as caused by chemical or photo-chemical processes. The reaction rate of such processes are reduced due to lower facet temperatures by employing the coatings of this invention. Also, COD levels are raised to new levels by the lower thermal resistance at the facet. As a result, higher output powers are achieved from the same device employing the coatings of this invention while maintaining or improving device lifetime and reliability.

As used herein "light emitting device" is intended to cover small component semiconductor or polymer light emitting devices such as semiconductor laser diodes, super-luminescent devices, semiconductor amplifiers and polymer-based light emitting devices. As used herein, the term, "coating" may be one or more layers or films of materials or compounds with the primary goal of achieving high thermal conductivity, such as, for example, higher than the thermal conductivity of the materials employed in the light emitting device. In the examples provided, such a high quality, high thermal conductivity may be achieved with one or more layers. In achieving additional attributes of chemical compatibility or stability and hermeticity or passivation, more than one layer may be preferably required. In all cases, the coatings set forth herein provide for optical transparency for the radiation wavelength emitted from the light emitting device. By "chemical stability" we mean a film in contact with the facet that maintains the chemical integrity of the facet and prevents facet decay due to chemical or photochemical reaction occurring at the facet.

In the past, coatings of facets were specifically designed with passivation and desired facet reflectivity level in mind without particular reference to those skilled in the art to thermal conductivity effects at the facet or the possible importance of efficient thermal transport of heat away from the device's emission area to reduce facet temperature. The temperature of the facet is a very important parameter in determining chemical stability and hermeticity. As indicated previously, the prior art has remained attentive only to chemical stability or passivation. By raising the level of thermal conductivity at one or both facets of the semiconductor laser device through an applied coating that provides for a higher degree of heat spreading and high thermal transport of heat away from the beam emission area of the light emitting device, the useful operating power as well as the probable operational lifetime and reliability of the light emitting device can be increased.

A major contribution to the generation of heat at the facet emission area is the optical power density, and optical power of devices in today's semiconductor laser devices has significantly increased over past such devices. The new mirror coating of this invention function as a heat spreading layer so that heat generated at the output facet is laterally spread across the cooler facet region immediately adjacent to the central hottest spot of the optical mode of the light emitting device so that this lateral heat spreading permits the heat to be absorbed by non-active layers of the device and the device substrate, for example. Therefore, this invention seeks and realizes a coating comprising one film or a combination of films that basically provide for high thermal conductivity either because of the facet material employed or because of its thickness to lower thermal resistance or a combination of both facet material and coating thickness. For maximum power and long term reliability of these light emitting devices, the facet coating should exhibit the three properties of high thermal conductivity, chemical stability, and hermeticity.

Thus, the high thermal conductivity of the coatings of this invention provide heat spreading at the facet emission region of the device, enabling heat to be more effectively carried away and, consequently, providing for lower facet temperature.

A first embodiment of this invention comprises a high thermal conductivity single layer applied to the device facet. Such a high thermal conductivity layer may be comprised of silicon carbide (SiC), boron nitride (BN), beryllium oxide (BeO), alumina ($Al_2O_3$), aluminum nitride (AlN), boron phosphide (BP), diamond, diamond-like carbon (DLC), boron oxide ($B_2O_3$) or magnesium oxide (MgO). The high thermal conductivity layer provides for an efficient transfer of heat away from the beam emission area of the front facet into regions adjacent to, i.e., above or below the active region of the device, such as layers of the device underlying the active region and the device substrate. Moreover, the layer can be extended to be in direct contact with the device submount in order to possibly further enhance heat conduction away from the facet.

The thickness of the layer can play an important role since thermal resistance decreases with increasing layer thickness.

Thus, for optimal designed reflectivity, such as, in the range of about 0% to 30% reflectivity, i.e., to make the reflectivity easily controlled relative to the desired coating thickness, the layer thickness should be approximately in the range of $\lambda/(4n)$ to $\lambda/(2n)$, where $\lambda$ is the oscillation wavelength of the light emitting device and n is the refractive index of the coating. Coating thicknesses outside this range are possible depending upon the thermal conductivity of the facet coating material. For example, a coating with a very high thermal conductivity may possibly have a useful thickness less than $\lambda/(4n)$, although thicknesses greater than $\lambda/(2n)$ are not ruled out. A thickness of greater than $\lambda/(2n)$ should be used for materials with somewhat lower thermal conductivity, such as alumina ($Al_2O_3$), to provide for lower thermal resistance to achieve higher thermal transfer benefits, while still maintaining the same facet reflectivity, as in the case of layers with thickness less than $\lambda/(2n)$, mentioned above. For example, a coating that is $N\lambda/(4n)$ (where N is an odd integer greater than 1, i.e., 3, 5, 7, etc.) thick provides the same reflectivity as a $\lambda/(4n)$ layer, yet provides much lower thermal resistance. However, the greater the integer N, the more sensitive the reflectivity is to thickness and, therefore, the more difficult it is to control the reflectivity. Moreover, the greater the thickness of the coating, the more difficult is the long term adhesion of the coating to the facet due to thermal conductivity differences with the material of the laser source. As a result the coating can eventually crack and peal off of the facet. However, in cases where the thermal conductivity of the coating is not substantially greater than GaAs, for example, such as alumina ($Al_2O_3$), the advantages of heat spreading can still be obtained by employing thicker coatings, i.e., greater than $\lambda/(2n)$. Thus, DLC, having a comparatively high thermal conductivity, need not be as thick as alumina, for example. The desired thickness of layers, therefore, depends upon the thermal conductivity of the chosen coating materials.

In another embodiment of the invention, a coating comprises two or three layers providing in combination high thermal conductivity at the emitting facet as well as hermeticity and chemical stability in the case where a single layer comprising the coating does not substantively provide all these properties. A first approach for a two layer coating comprises a first transition layer of alumina ($Al_2O_3$), GaP, ZnSe, or the like, providing good chemical stability on the out-put facet, such as in the case of output facets of an AlGaInP or AlGaAs laser diode. In one embodiment, a first transition layer in contact with the facet provides for chemical stability and has a thickness sufficient to provide good chemical stability, which thickness is in the range of about 20 Å to about 2,000 Å. A second, thermal transfer layer provides for high thermal conductivity and hermeticity and may have a thickness greater than approximately $\lambda/(4n)$. The material for the second layer, transparent to the device light, may be comprised of high thermal conducting materials, such as, SiC, BN, BeO, AlN, BP, DLC, $B_2O_3$ or MgO or the like. The thickness of the second layer is preferably in the range of about 1,000 Å to about 5,000 Å, but optimum thickness is also dependent upon the chosen method of deposition of the material and is somewhat dependent upon the thermal conductivity of the material employed for this layer.

In a second approach for a two layer coating, a first layer may exhibit both properties of chemical stability and good thermal conductivity, while the second layer may also have the quality for hermeticity. An example of such a layer combination is a thick layer $Al_2O_3$ (i.e., thickness greater than $\lambda/2n$) and a second layer of $HfO_2$, $SIN_x$, SiC, $SiO_2$, $ZrO_2$ or $TiO_2$, which may be sufficiently thick to provide for good hermeticity, such as, for example, having a thickness in the range of about 20 Å to about 2,000 Å. The exact thickness of the outer layer of $HfO_2$, $SIN_x$, SiC, $SiO_2$, $ZrO_2$ or $TiO_2$ is also adjusted to achieve the desired level of reflectivity.

It is possible to provide for a high thermal conductivity coating with any arbitrary number of layers providing the basic benefits of thermal conductivity, chemical stability and hermeticity, but the additional complexity of more than three layers is generally to be avoided from the standpoint of additional costs and manufacturing complexity in depositing multiple layers as well as the complexity of maintaining the desired level of reflectivity at the facet, which is generally 30% or less.

For all of the foregoing embodiments, the exact, desired reflectivity must be obtained by proper adjustment of the layer thickness. With increasing number of layers employed for a coating, control of the desired level of reflectivity becomes more difficult. Therefore, it is preferred to employ a high thermal conductive coating with a minimum amount of layers, the optimum being a single layer.

The foregoing and other features and advantages of the invention will be apparent from the following, more particular description of several preferred embodiments of the invention, as illustrated in the accompanying drawings.

DETAILED DESCRIPTION OF THE PREFERRED EMBODIMENTS

The preferred embodiments of the invention are now described with reference to the figures. While specific steps, configurations and arrangements are discussed, it should be understood that this is done only for purposes of illustration. A person skilled in the relevant art will recognize that other steps, configurations and arrangements can be used without departing from the spirit, objective and scope of the invention.

Figure 1A:
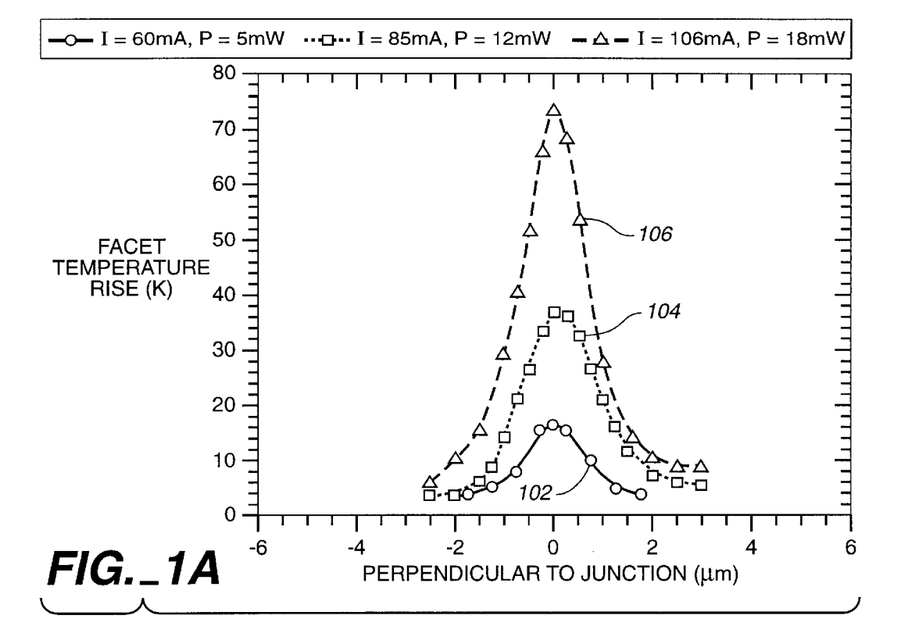
FIG. 1A is a graphic illustration of the temperature profiles transverse to the device junction of a single mode semiconductor laser device to the junction at several power levels.
Figure 1B:
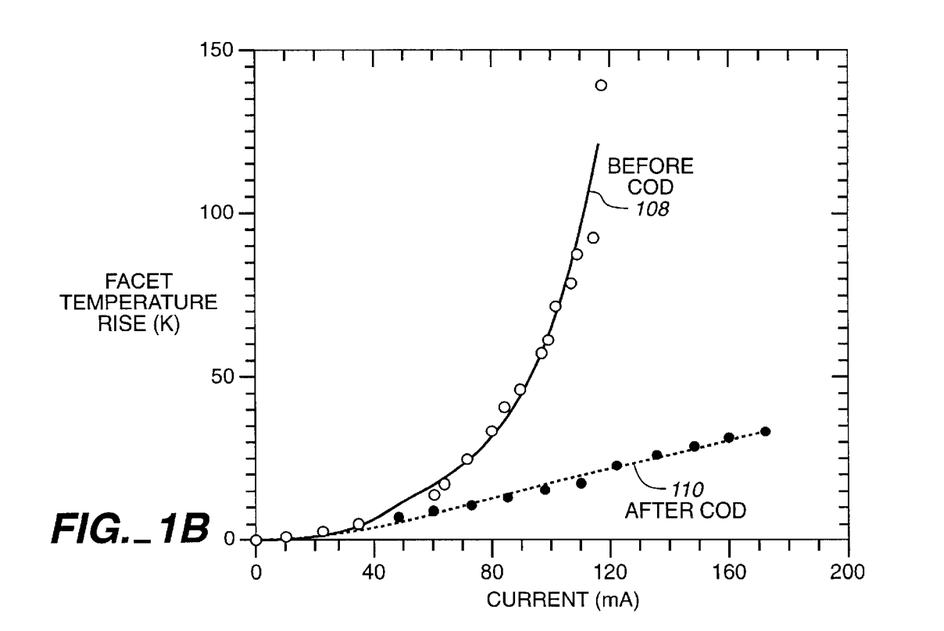
FIG. 1B is a graphic illustration of the peak facet temperature rise as a function of drive current, before and after COD, for the single mode semiconductor laser device of FIG. 1A.

The output facet temperature of a light emitting device can increase substantially above that of the device's substrate during its operation due to highly localized absorption at the output facet. Temperature measurements of the output facet of operating semiconductor lasers confirm this localized effect. FIG. 1A, for example, shows the output facet temperature profiles at various power levels for a single-mode laser device fabricated from an AlGaInP material system and operating at 635 nm. In this figure, the distance perpendicular to the active laser junction is plotted on the abscissa with units measured in micrometers ($\mu$m) and degrees Kelvin (K) are plotted on the ordinate axis. Three separate profiles 102, 104, and 106 at different diode input currents with corresponding output powers are illustrated. When the peak of such a profile is plotted as a function of injection current, a curve like 108 in FIG. 1B is produced. As COD is approached, as indicated by the rapid increase in curve 108 of FIG. 1B, the facet temperature rise may be several hundreds of degrees centigrade. Under normal circumstances, heat is removed only from one side of the surface, since the cleaved facet only has a thin approximately 1200 Å, poorly conductive coating layer, leading to this large temperature rise. FIG. 1B also shows the facet temperature rise after COD at curve 110, indicating that the initial facet heating is not due to current, but is due to optical power density absorption.

Figure 2:
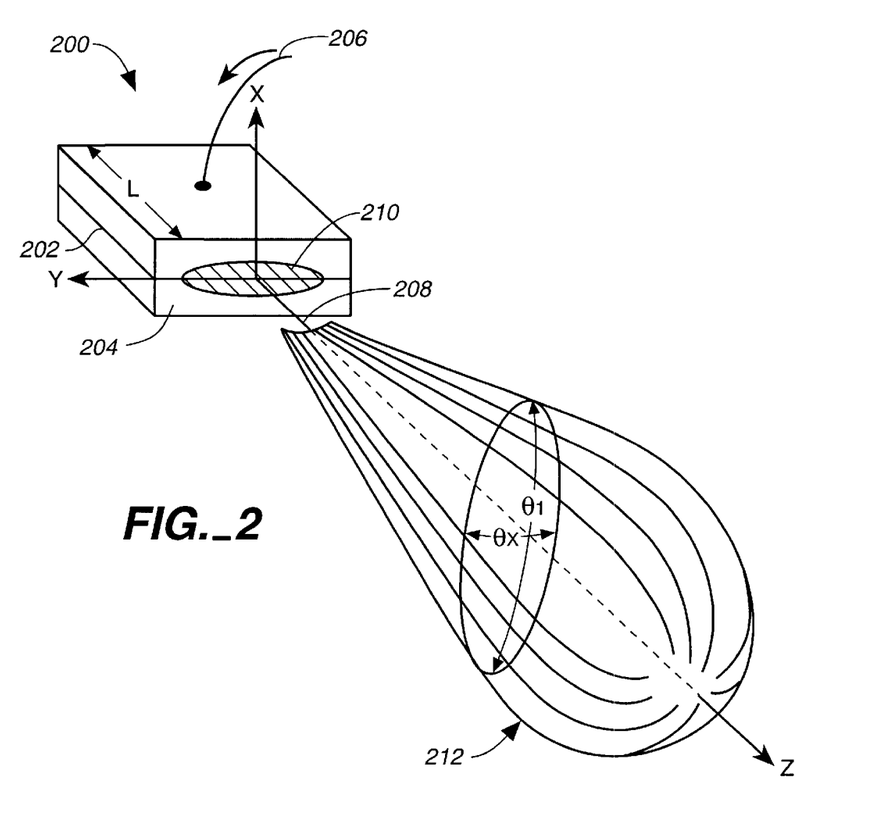
FIG. 2 is a perspective view of a conventional single mode light emitting device comprising a semiconductor laser diode.

An exemplary light emitting device 200, e.g., a laser diode, is shown in FIG. 2. Device 200 includes one or more p-n junctions, shown generally as a junction plane 202. A cleaved facet, which may function as an output facet, is shown at 204. When current is applied at 206 to the light emitting device, the device lases causing light emission 208 through an optical aperture 210 at output facet 204. The emitted light has a characteristic shape referred to as a radiation lobe 212. Typically, passivation films are formed on the output facet 204 and function as an optically transparent insulating material. As previously indicated, examples of such transparent insulating materials include silicon dioxide ($SiO_2$), alumina ($Al_2O_3$) or the like.

As indicated previously, U.S. Pat. No. 4,337,443 to Umeda et al., discloses the use of a hydrogenated amorphous silicon ($\alpha$-Si) film as a protection film on the output facet. Umeda et al. do not address any thermal conductivity effects achieved by the protection film.

Also, as previously indicated, U.S. Pat. No. 4,951,291 Miyauchi et al. discloses a multilayer dielectric on the output facet having a reflectivity of approximately 5% at a laser oscillation wavelength, e.g., 7800 Å. The multilayer structure of Miyauchi et al. includes a first layer deposited directly on the output facet of $Al_2O_3$ at a thickness of 2,650 Å, a second layer of $\alpha$-Si:$H_2$ at a thickness of 100 Å, and a third layer of $Al_2O_3$ formed on the second layer at a thickness of 2,167 Å. The Miyauchi et al. structure is intended to prevent deterioration of the semi-conductor laser device by suppressing oxidation of the front facet over a long period of time. However, there is no expectation, understanding or motivation from Umeda et al. and Miyauchi et al. that a single thick layer of material itself, has any quality with respect to thermal conductivity and thermal transport of heat generated at the area of beam emission from the light emitting device. Moreover, there is no indication, suggestion or contemplation of the possibility of achieving higher COD values based upon the use of a single layer coating while capable of maintaining the desired level of reflectivity comprising reflectivity levels of 30% or less. In particular, the grouped materials selected by Umeda et al. and Miyauchi et al. still may not provide sufficient thermal conductivity to effectively increase COD for today's laser diodes, which can reach optical output power densities of up to on the order of 10 megawatts/$cm^2$.

Also, as previously indicated, U.S. Pat. No. 4,860,305 to Miyauchi et al. discloses a laser device 1 having a single film 51 of $Al_2O_3$ at the laser diode front facet. However, there is no indication of layer thickness or recognition of the properties for a single layer for achieving high thermal transport of heat away from the beam emission area at the front facet resulting in an increase in COD which correspondingly results in an increase in the life of the laser diode.

Figure 3:
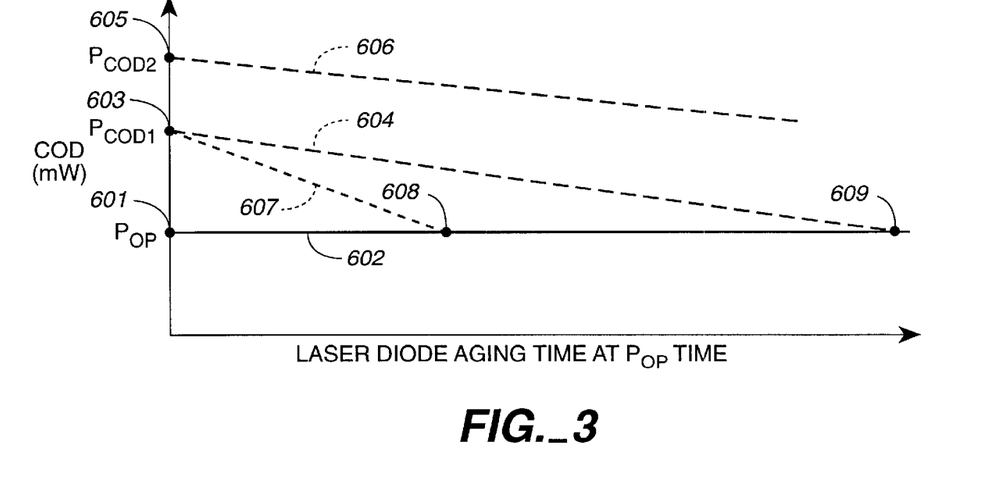
FIG. 3 is a graphical illustration of the power at rated laser operation over time versus the power at COD which decreases differently over time for no facet coating and different facet coatings comprising those of the conventional art and those of this invention.

FIG. 3 illustrates the effect of COD level relative to the aging process of a semiconductor laser diode. This is important in the understanding as to why coating thermal conductivity is an important parameter in suppressing temperature dependent facet degrading mechanisms. In FIG. 3, the aging process for a typical diode without a facet coating is illustrated by dash line 607 relative to its established catastrophic optical damage (COD) level, $P_{COD1}$, at 603 and the normal or rated operating power, $P_{OP}$, over time as indicated by line 601. The several dotted lines of FIG. 3 represent degrees of COD level reduction over time due to aging. As known in the art, these lines may be curved, particularly at their early stages of aging time rather than linear as shown in FIG. 3. However, they are shown as linear for purposes of illustrating the thermal transport effects of the invention. When the COD level finally, over aging time, reaches laser diode operational line 602 at 608, then the facet of the laser diode fails, causing catastrophic device failure.

More particularly, 602 represents the operation of a laser diode at its rated power, $P_{OP}$, for the lifetime of the diode. Its $P_{COD1}$ level at point 603 is relative to a laser diode that has been relatively low or no facet surface passivation. The COD level, indicated by dash line 607, will begin to decline indicating decay over time, due to temperature dependent facet degrading mechanisms and failure will occur upon reaching its end of lifetime at 608. Those skilled in the art have sought and achieved coatings for output laser diode facets that have significantly extended laser diode life by providing good facet passivation, which is represented by dash line 604, extending the lifetime operation of the laser device to a point of failure at line 602 extending to point 609. We have discovered properties of certain single and multiple facet, coatings that, with proper consideration of the thicknesses and thermal properties of the facet coating layer or layers, the coating will result in an increase in the $P_{COD}$ level to a higher limit for the same laser diode, i.e., to a $P_{COD2}$ level at point 605. The increase in the COD level to point 605 from point 603 will extend the operational lifetime of the laser diode many times more over that of coatings designed purely for passivation, as seen by dash line 606 which has a point of failure at line 602 extensively well beyond the view of FIG. 3 compared to line 604. These coatings provide for high thermal conductivity, i.e., high thermal transport of heat away from the region of laser beam emission at the facet as well as good passivation. The attributes for achieving high thermal transport facet coatings, as illustrated in FIG. 3, have not been recognized or understood by those skilled in the art.

In order to obtain a facet coating that provides for high thermal conductivity at the light emitting device facet, the inventors have developed several new coatings.

Figure 4:
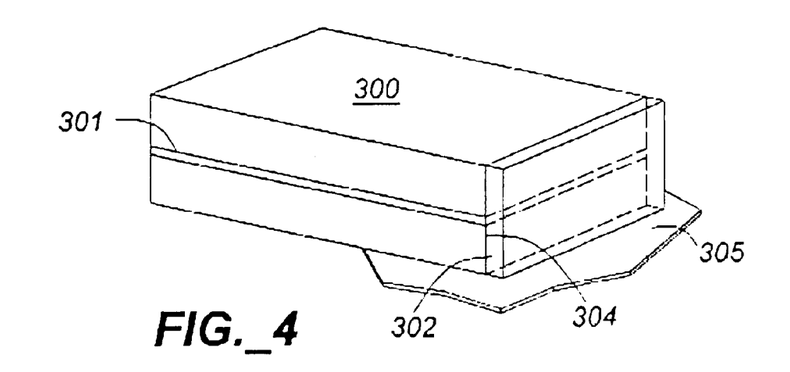
FIG. 4 is a perspective view of a light emitting device with a single layer coating according to this invention on the device facet.

Reference is now made to FIG. 4 comprising light emitting device 300 having active region 301 with a single layer, high thermal conductivity coating 302 provided on the front facet 304 of device 300. Materials with high thermal conductivity, e.g., higher than the thermal conductivity of the material of light emitting device 300, are chosen for coating 302. If the chosen material for the coating does not have a thermal conductivity higher than the material of the light emitting device, lowering thermal resistance of the material is taken into consideration so that the layer thickness is increased to achieve higher thermal transport in the coating, also taking into account a thickness that also provides for a desired level of reflectivity of the device out-put. Examples of thermal conductivity of materials comprising device 300 are GaAs which is about 0.44 W/cm° C., GaInP which is about 0.07 W/cm° C., and AlGaInP which is about 0.06 W/cm° C. Other materials are AlGaAs, GaInAsP, Group II–VI materials and light emitting polymers. Examples of coating materials are silicon carbide (SiC) which is about 4.9 W/cm° C., boron nitride (BN) which is 3 W/cm° C., beryllium oxide (BeO) which is about 3.7 W/cm° C., aluminum nitride (AlN) which is about 1.7 W/cm° C., and diamond which is about 12 W/cm° C. In these cases, a coating of $\lambda/(2n)$ or less may be sufficient where $\lambda$ is the oscillation wavelength of the light emitting device, n is the refractive index of the coating. For designed reflectivity levels at the facet in the range of 0% to about 30%, it is easier to achieve the desired reflectivity level in the case where the single layer thickness is $\lambda/(2n)$ or less. A single coating of SiC, BN, BeO, AlN, BP, diamond, DLC, $B_2O_3$ or MgO having a thickness of $\lambda/(2n)$ or less has the capability for both the properties of high thermal transport of heat away from the area of emission of the output beam from the facet as well as possibly providing some surface passivation. In cases where materials with lower thermal conductivity, such as alumina, are used, the thickness of the single layer may, by necessity, be greater than $\lambda/(2n)$ to provide for high thermal conductivity while still maintaining the desired level of facet reflectivity, usually about 30% or less. For example, if a GaAs laser device is chosen with a thermal conductivity of 0.44 W/cm° C., then the selection of alumina with a thermal conductivity of 0.25 W/cm° C., as a thin coating so as not to substantially interfere with the desired reflectivity level, is not appropriate unless its coating thickness is increased by $N\lambda/4n$ to enhance thermal transport of the layer by means of lower thermal resistance. Thus, a single layer coating that is $m\lambda/(2n)$ (where m is a positive integer) thick provides the same reflectivity as a $N\lambda/(4n)$ thick layer, yet provides for significantly greater thermal conductivity since the thermal resistance is made lower. However, it should be realized that the greater the integer N, the more sensitive the reflectivity is to increasing layer thickness. Thus, there is a balance between increased layer thickness to achieve greater thermal transport of heat and achieving and maintaining a proper level of reflectivity and it becomes increasingly difficult to control reflectivity with increasing layer thickness. Therefore, it is preferred to select the integer N to be of not too large of a value. Thus, if the thickness becomes too large to control reflectivity to a desired level, then the coating material from the above identified group of coating materials is selected so as to have a higher thermal conductivity than the material of the light emitting device.

Alternatively, the single layer can be replaced with a bulk material or slab. For example, a bulk piece or slab of diamond, DLC or AlN may be placed on the device facet. The bulk material will serve to provide good thermal transport of heat away from the area of light emitting beam emission.

Figure 5:
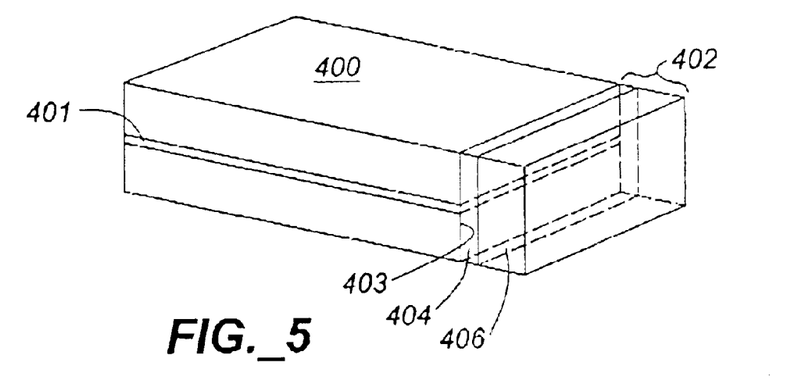
FIG. 5 is a perspective view of a light emitting device with a multilayer coating according to this invention on the device facet.

A coating comprising multiple layers at the output facet of a light emitting device is illustrated bin FIG. 5. According to FIG. 5, light emitting diode 400 has an active region 401 and includes a multilayer mirror coating 402 on facet 403, which may be the laser output facet. Multilayer mirror coating 402 comprises a first layer 404 and a second layer 406. There are two different approaches for a two layer coating. The first approach is the provision of a thin first layer 404 applied to the laser diode facet for chemical stability and a second thicker layer 406 applied to the first layer for heat transfer and hermeticity. The second approach is the provision of a thick first layer 404 applied to the laser diode facet for chemical stability and heat transfer and a second thinner layer 406 applied to the first layer for hermeticity.

Relative to the first approach, the first interface or transition layer 404 may comprise alumina ($Al_2O_3$), gallium phosphide (GaP), zinc selenide (ZnSe), or a like material to maintain good chemical stability at the output facet. The interface layer 404 has a typical thickness in the range between about 20 Å and about 2,000 Å. The exact value of this thickness should be adjusted to obtain the proper reflectivity of the multilayer mirror coating 402, as would be apparent to those persons skilled in the art. Second layer 406 is a heat spreader layer comprising a highly thermal conductive material, such as SiC, BN, BeO, AlN, BP, DLC, $B_2O_3$, MgO or other highly thermal conductive material, preferably having a thermal conductivity greater than that of the materials that comprise the laser diode, such as a GaAs/AlGaAs material system (i.e., approximately 0.44 W/cm° C.). Layer 406 may be formed by evaporation or sputtering. Typical thickness for second layer 406 is in the range of about 1,000 to about 5,000 Å. Again, the exact value for the thickness of second layer 406 should be adjusted so as to obtain the proper reflectivity of multilayer mirror coating 402.

To be noted relative to the first approach that alumina is not recommended for the second layer as a thermal conductive material but rather is employed basically as a thin chemical stability first layer of the two layer coating. One reason is that the thermal conductivity of 0.25 W/Cm° C. for alumina does not generally lend itself as a preferred heat spreader relative to a laser diode material system that possesses higher thermal conductivity properties such as a GaAs/AlGaAs material system of about 0.44 W/Cm° C., mentioned above. However, by making such a first layer of alumina sufficiently thick, the advantages of heat spreading can still be achieved in a single coating of alumina greater than $\lambda/(2n)$, such a coating falling within the previous discussion concerning FIG. 4 or relative to the second heat spreading layer for the second approach of a two layer coating to be discussed next. In this connection, see also Table 2, infra, which illustrates the results for thicker layers of alumina.

With respect to the second approach, multilayer coating 402 comprises a first heat transfer layer 404 of a thick layer of alumina to provide heat spreading and a second layer 406 comprising $HfO_2$ or the like for good hermeticity. A preferred embodiment relative to this second approach is a thick layer $Al_2O_3$ (i.e., thickness greater than $\lambda/2n$) and a second layer of $HfO_2$ which is made sufficiently thick to provide for good hermeticity, such as, for example, having a thickness in the range of about 20 Å to about 2,000 Å. Other example materials for the second hermeticity layer are $SiN_x$, SiC, $SiO_2$, $ZrO_2$ or $TiO_2$. The exact thickness of the outer layer of $HfO_2$, $SiN_x$, SiC, $SiO_2$, $ZrO_2$ or $TiO_2$ is also adjusted to achieve the desired level of reflectivity.

In order to efficiently spread heat on the output facet of present day laser diodes, such as a laser diodes manufactured by SDL, Inc., of San Jose, Calif., the high thermally conductive coating should be able to withstand optical output power densities of up to on the order of 10–100 megawatts/$cm^2$. The coatings of this invention are able to do so.

Figure 6:
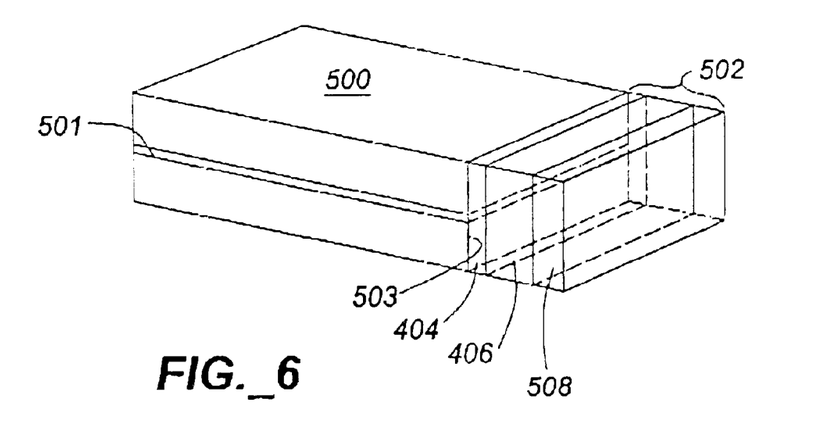
FIG. 6 is a perspective view of a light emitting device with a multilayer coating according to this invention on the device facet.

Another embodiment of the present invention is shown at FIG. 6. A light emitting device, in particular, a semiconductor laser diode, is shown generally at 500 having an active layer 501. In this embodiment, a multilayer mirror coating 502 comprises a first layer 404, a second layer 406 and a third layer 508. Layers 404 and 406 are as described relative to the description for the embodiment of FIG. 5 and may be comprised of a combination of materials as described. Layer 508 may be comprised of a material providing hermetic protection to first and second layers 404 and 406 as well as output facet 503. For achieving proper reflectivity and oxidation resistance, third layer 508 may be comprised of silicon nitride ($SiN_x$), for example, having a thickness in the range of about 20 Å to about 2,000 Å. Alternatively, hafnia ($HfO_2$) may be used in place of $SiN_x$, also having a thickness in the range of about 20 Å to about 2,000 Å. Other materials that are applicable for hermetic sealing layer 508 are $ZrO_2$, $SiO_2$, SiC or $TiO_2$.

While the coatings in the foregoing embodiments of FIGS. 4–6 have been illustrated as applied to one facet of the light emitting device, it should be understood that these coatings may be employed on other facets of the devices as desired.

The layers in the foregoing embodiments may be deposited by sputtering, evaporation by PECVD, or any applicable process, as would be apparent to one of ordinary skill in the art. In general, low temperature processes are preferred.

The foregoing embodiments provide a multilayer mirror coating of superior thermal conductivity for suppressing the occurrence of temperature dependent facet degrading mechanisms in a light emitting device. The thickness of the thermal transfer layer required for the specific device temperature rise scales approximately inversely with thermal conductivity. Of course, facet reflectivity is influenced by these coatings and has to be taken into account as would be apparent to a person skilled in the art.

The inventors have modeled an example of the present invention using finite element analysis of a typical 4 μm wide laser diode bonded p-side down. The thermal resistance, $R_{th}$, in degrees centigrade per watt (° C./W) of absorbed optical power and the temperature rise assuming 10 mW of absorbed optical power were calculated at the output facet. The results of this calculation are presented below in Table 1. The parameter $C_{th}$ in this table is the thermal conductivity of a 0.25 μm thick facet coating used for the calculation relative to all of the materials listed. The values of 0.0 W/cm° C., 0.2 W/cm° C. and 12 W/cm° C. in Table 1 correspond, respectively, to no facet coating, a coating with alumina, and a coating with diamond. Other values of 0.5 W/cm° C., 1.0 W/cm° C. and 5.0 W/cm° C. are calculated for thermal conductivity values between alumina and diamond. The value of 5.0 W/cm° C., for example, is close to that for SiC. These values of thermal conductivity clearly illustrate the decrease of thermal resistance accompanied with a lowering of the facet temperature.

TABLE 1

| $C_{th}$ (W/cm ° C.) of Facet Coatings | $R_{th}$ (° C/W) | Facet Temperature Increase (° C.) |
|---|---|---|
| 0.0 | 16,100 | 161 |
| 0.2 (Alumina) | 13,600 | 136 |
| 0.5 | 11,200 | 112 |
| 1.0 | 8,900 | 89 |
| 5.0 | 4,000 | 40 |
| 12 (Diamond) | 2,500 | 25 |

As is apparent from Table 1, a factor of 5 or more temperature reduction in the area of the beam emission is achieved by coating with a highly thermally conductive material such as in the case of DLC.

From a general point of view of reducing facet temperature through thicker layers of a coating applied to a laser diode facet to increase heat spreading through decrease in thermal resistance, the example of alumina layers of varying thicknesses is given below in Table 2. FIG. 2 shows that, as the thickness of the alumina layer is increased, the thermal resistance, $R_{th}$, decreases so that the temperature at the facet is reduced, extending the life of the diode.

TABLE 2

| $Al_2O_3$ Thickness μm | $R_{th}$ (° C/W) | Facet Temperature Increase (° C.) |
|---|---|---|
| 0 | 16,100 | 161 |
| 0.12 | 14,700 | 147 |
| 0.25 | 13,600 | 136 |
| 0.62 | 11,200 | 112 |

Some consideration has also been given in this invention to the desire of having some thermal communication in facet heat transfer from the high thermal conductive coating directly to the laser diode submount or heatsink. However, while such direct thermal coupling would provide some enhanced heat removal, and is within the intended scope of this invention, it is believed that it is not required since the primary purpose of the coating relative to this attribute is to conduct heat away from the beam emission area of the facet to reduce the temperature of the facet, which area is where the highest facet temperature exists. This transfer of heat from the emission area is accomplished by high thermal conduction directly through the laser diode layers above and below its active region, including its substrate. However, the facet coating may be extended to the submount with the high thermal conductivity coating applied after the light emitting device is secured to the submount. Thus, deposition of a high thermal conductivity material on the device facet extends directly to the heatsink or submount providing a direct thermal path for heat transfer directly to the heatsink or submount, which may also include some thermal conductivity through the layers between the device active region and substrate that are below the active region of the device. As an example of this approach, an ECR PECVD deposition system may be employed to deposit diamond-like carbon (DLC) at a temperature below the growth temperatures of the device, such as below 400° C., which is thermally compatible with the metalizations used in connection with these light emitting devices.

While various embodiments of the present invention have been described above, it should be understood that they have been presented by way of example, and not limitation. It will be apparent to persons skilled in the relevant art that various changes in form and detail can be made therein without departing from the spirit and scope of the invention. Thus the present invention should not be limited by any of the above-described exemplary embodiments, but should be defined only in accordance with the following claims and their equivalents.

What is claimed is:

1. A light emitting device comprising:

a plurality of deposited layers with faces formed in plane transverse to the longitudinal extent of said layers forming longitudinal ends of the device, the device being fabricated from a material capable of producing light;

said light being emitted as a beam from at least one of said facets and generating heat thereat; and a singe layer coating formed on at least one of said facets for transferring heat therefrom to increase the useful life of the device, said coating having a thickness near $N\lambda/(4n)$, where N is an odd integer greater than 1, so as to provide a facet reflectivity level substantially the same as a $\lambda/(4n)$ thick layer but with improved heat transport quality, where $\lambda$ is the oscillation wavelength of the device and n is the refractive index of the coating, and having a thermal conductivity higher than the thermal conductivity of the said device material.

2. The light emitting device of claim 1 wherein the device material is a Group III-V material.

3. The light emitting device of claim 2 wherein the device material comprises GaAs, AlGaAs, GaInP, GaInAsP, or AlGaInP.

4. The light emitting device of claim 1 wherein the device material is a Group II-VI material.

5. The light emitting device of claim 1 wherein the device material comprises light emitting polymers.

6. The light emitting device of claim 1 wherein said coating comprises a single layer of SiC, BN, BeO, AlN, BP, MgO, $B_2O_3$, diamond or diamond-like carbon.

7. The light emitting device of claim 1 wherein said coating comprises a bulk diamond material secured to said one facet.

8. The light emitting device of claim 1 wherein the thickness of said layer is selected to provide, in combination, a reflectivity of 30% or less and to provide for thermal transport of heat away from the facet.

9. The light emitting device of claim 1 wherein the thickness is selected to provide for lower thermal resistance so that said coating provides for a larger thermal transfer path under the conditions where said coating does not provide a sufficiently higher level of thermal conductivity compared to the thermal conductivity of the device material.

10. The light emitting device of claim 9 herein said coating comprises a single layer of SiC, BN, BeO, AlN, BP, alumina, diamond or diamond-like carbon, $B_2O_3$ or MgO.

11. The light emitting device of claim 1 wherein said coating comprises a slab secured to said one facet, said slab comprising diamond, diamond-like carbon or AlN.

12. The light emitting device of claim 1 where the device is mounted on a submount or substrate, said facet coating extending to said submount or substrate.

13. The light emitting dice of claim 1 wherein said light emitting device comprises a semiconductor light emitting device or a polymer light emitting device.

14. The light emitting device of claim 13 wherein said semiconductor light emitting device comprises a laser diode, a laser diode array, a superluminescent device or a semiconductor optical amplifier.

15. A light emitting laser device comprising:

laser beam emission area from at least one of its facets;

a coating of alumina formed on said one facet having a thickness near $N\lambda/(4n)$, where N is an odd integer greater than 1, so as to provide a facet reflectivity level substantially the same as $\lambda/(4n)$ thick layer but with lower thermal resistance to improve the heat transport quality of the coating, where $\lambda$ is the oscillation wavelength of the laser device and n is the refractive index of the coating.

16. The light emitting device of claim 15 wherein the odd integer is chosen to be a small number.

* * * * *